US012588266B2

(12) United States Patent
Kang et al.

(10) Patent No.: US 12,588,266 B2
(45) Date of Patent: Mar. 24, 2026

(54) CMOS INTEGRATION FOR DOPED PLACEHOLDER AS DIRECT BACKSIDE CONTACT

(71) Applicant: INTERNATIONAL BUSINESS MACHINES CORPORATION, Armonk, NY (US)

(72) Inventors: Tsung-Sheng Kang, Ballston Lake, NY (US); Tao Li, Slingerlands, NY (US); Ruilong Xie, Niskayuna, NY (US); Nicolas Jean Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 430 days.

(21) Appl. No.: 18/470,117

(22) Filed: Sep. 19, 2023

(65) Prior Publication Data

US 2025/0098268 A1 Mar. 20, 2025

(51) Int. Cl.
| | |
|---|---|
| *H10D 64/23* | (2025.01) |
| *H10D 30/43* | (2025.01) |
| *H10D 30/67* | (2025.01) |
| *H10D 62/10* | (2025.01) |
| *H10D 84/01* | (2025.01) |
| *H10D 84/03* | (2025.01) |
| *H10D 84/85* | (2025.01) |

(52) U.S. Cl.
CPC ........... *H10D 64/256* (2025.01); *H10D 30/43* (2025.01); *H10D 30/6735* (2025.01); *H10D 30/6757* (2025.01); *H10D 62/121* (2025.01); *H10D 84/017* (2025.01); *H10D 84/038* (2025.01); *H10D 84/85* (2025.01)

(58) Field of Classification Search
CPC ............... H10D 64/256; H10D 84/017; H10D 84/0186; H10D 30/6735; H10D 30/6757; H10D 62/121; H10D 84/85; H10D 84/8312; H10D 30/014; H10D 62/151; H10D 84/851
See application file for complete search history.

(56) References Cited

U.S. PATENT DOCUMENTS

| | | | |
|---|---|---|---|
| 10,797,139 | B2 | 10/2020 | Morrow |
| 11,264,481 | B2 | 3/2022 | Park |
| 11,569,364 | B2 | 1/2023 | Tsai |
| 2021/0111115 | A1 | 4/2021 | Patrick |
| 2021/0134721 | A1 | 5/2021 | Chiang |
| 2021/0202385 | A1 | 7/2021 | Huang |
| 2021/0305252 | A1 | 9/2021 | Chiang |
| 2021/0305381 | A1 | 9/2021 | Chiang |
| 2021/0351303 | A1 | 11/2021 | Ju |
| 2021/0376071 | A1 | 12/2021 | Liu |

(Continued)

*Primary Examiner* — Wasiul Haider
(74) *Attorney, Agent, or Firm* — Samuel A. Waldbaum

(57) ABSTRACT

A microelectronic structure includes a first nanosheet transistor that includes a first source/drain and a second source/drain. The first source/drain and the second source/drain are doped with a first material. A second nanosheet transistor that includes a third source/drain and fourth source/drain. The third source/drain and the fourth source/drain are doped with a second material. The first material and the second material are different. A placeholder is located on a backside surface of the second source/drain and the placeholder is doped with a third material. The third material is the same as the first material.

20 Claims, 23 Drawing Sheets

CROSS-SECTION X1

(56)  References Cited

U.S. PATENT DOCUMENTS

| | | | |
|---|---|---|---|
| 2021/0376093 A1 | 12/2021 | Chu | |
| 2021/0391421 A1 | 12/2021 | Chu | |
| 2022/0139911 A1* | 5/2022 | Wei | H01L 23/5226 |
| | | | 257/365 |
| 2022/0352339 A1 | 11/2022 | Wang | |
| 2023/0093101 A1 | 3/2023 | Xie | |
| 2023/0098930 A1 | 3/2023 | Tsai | |
| 2024/0413223 A1* | 12/2024 | Tsai | H10D 30/6757 |

* cited by examiner

TOP DOWN VIEW

FIG. 3
CROSS- SECTION X2

FIG. 2
CROSS- SECTION X1

CROSS- SECTION Y

130

137

110

135

106

105

FIG. 6
CROSS- SECTION X2

FIG. 5
CROSS- SECTION X1

CROSS- SECTION Y

CROSS- SECTION X2

CROSS- SECTION X1

CROSS- SECTION Y

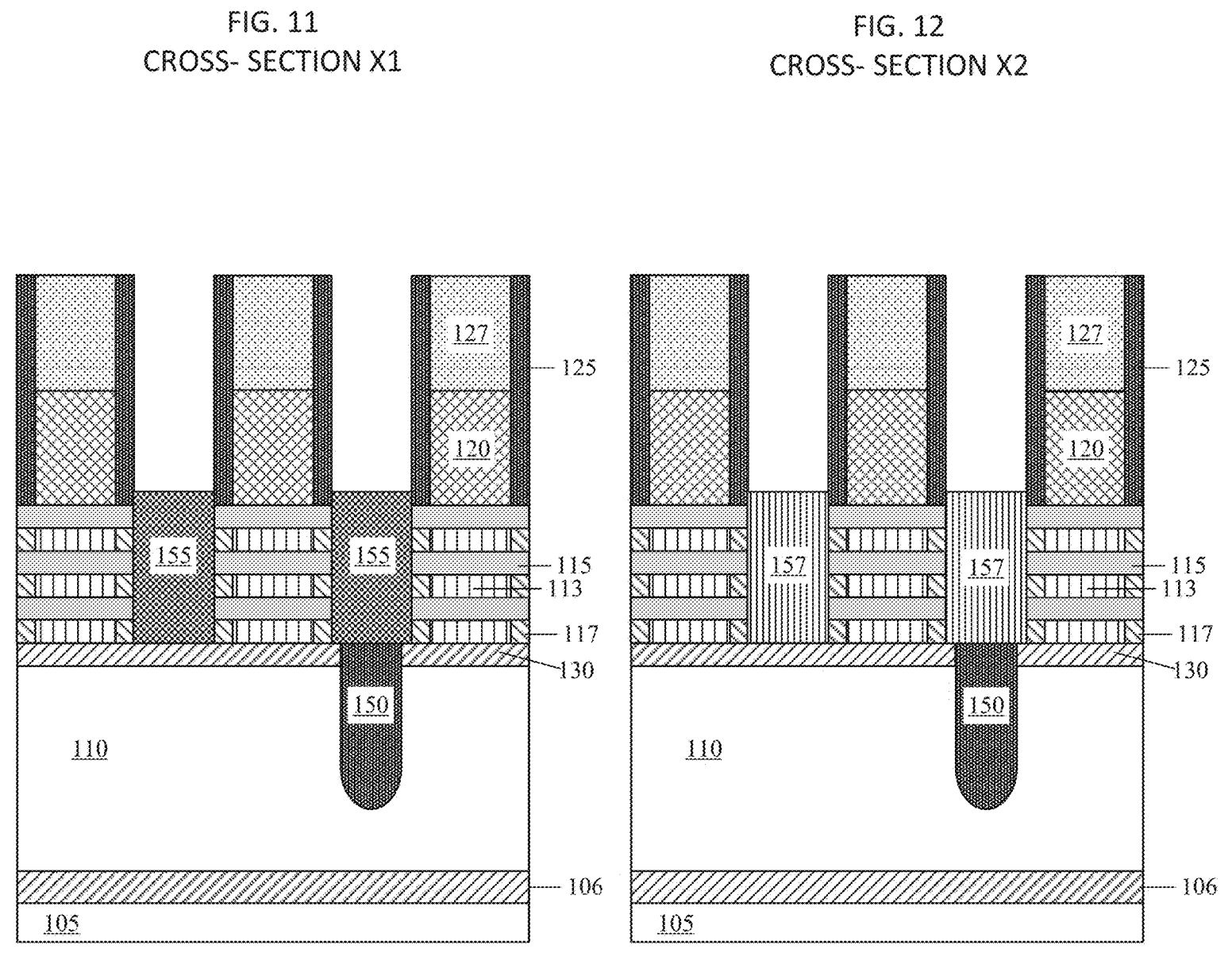

FIG. 12
CROSS-SECTION X2

125
127
120
115
113
117
130
157
157
150
110
106
105

FIG. 11
CROSS-SECTION X1

125
127
120
115
113
117
130
155
155
150
110
106
105

CROSS- SECTION Y

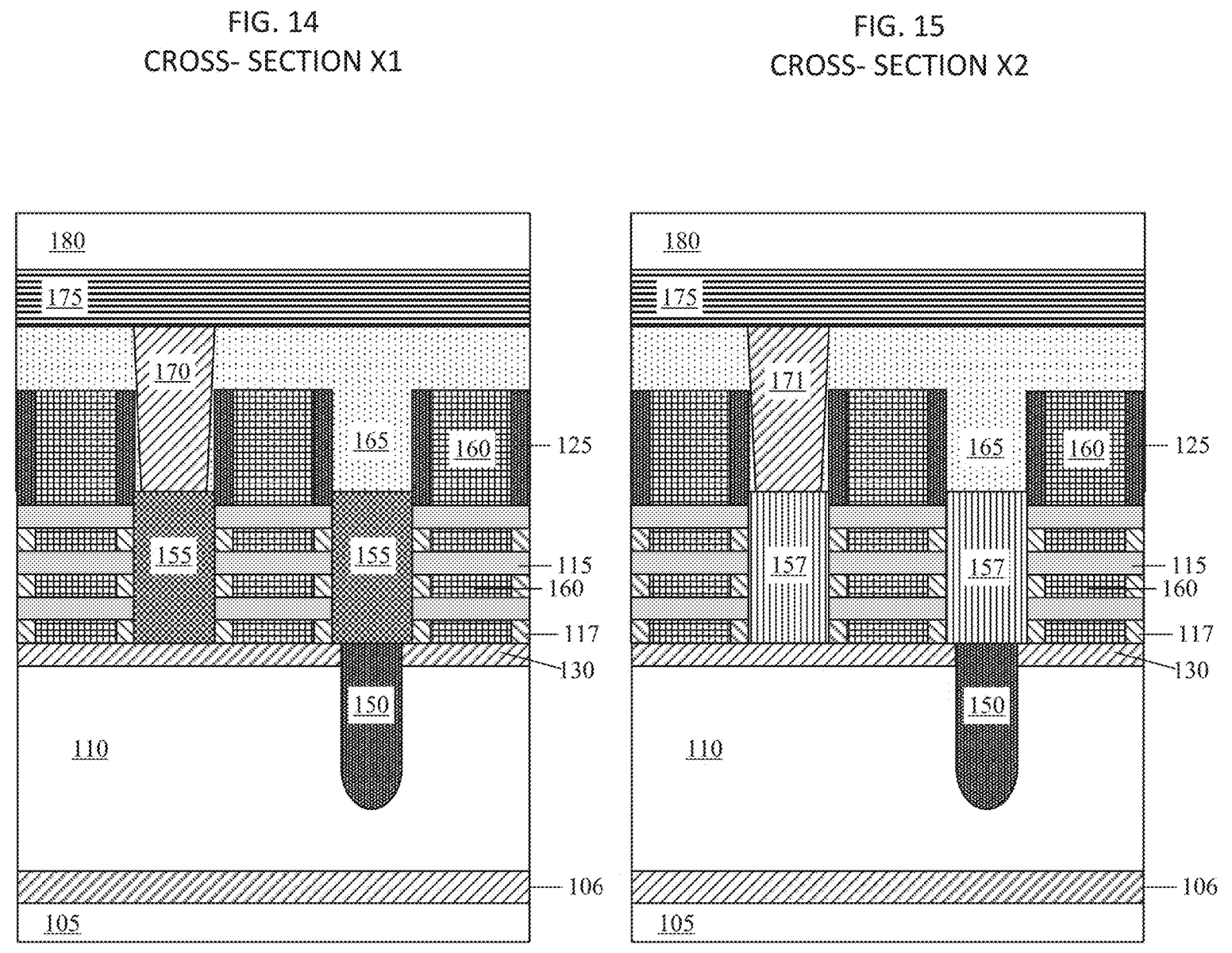

FIG. 15
CROSS- SECTION X2

125
115
160
117
130
106

180
175
165
171
157
150
110
105

FIG. 14
CROSS- SECTION X1

125
115
160
117
130
106

180
175
165
170
155
157
150
110
105

CROSS- SECTION Y

FIG. 18
CROSS- SECTION X2

FIG. 17
CROSS- SECTION X1

CROSS- SECTION Y

FIG. 21
CROSS- SECTION X2

FIG. 20
CROSS- SECTION X1

CROSS- SECTION Y

FIG. 23
CROSS- SECTION X1

FIG. 24
CROSS- SECTION X2

CROSS- SECTION Y

CROSS- SECTION X1

CROSS- SECTION X2

FIG. 28
CROSS- SECTION Y

DOPANT

205

135

210

137

185

150

155

175

180

207

212

165

FIG. 30
CROSS- SECTION X2

FIG. 29
CROSS- SECTION X1

CROSS- SECTION Y

FIG. 33
CROSS- SECTION X2

FIG. 32
CROSS- SECTION X1

CROSS- SECTION Y

CMOS INTEGRATION FOR DOPED PLACEHOLDER AS DIRECT BACKSIDE CONTACT

BACKGROUND

The present invention generally relates to the field of microelectronics, and more particularly to the formation of a doped source/drain.

Nanosheet is the lead device architecture in continuing CMOS scaling. However, nanosheet technology has shown issues when scaling down such that as the devices become smaller and closer together, they are interfering with each other. With the number of devices being fitted in a smaller area it is becoming harder to form separate backside contacts that have enough surface contact with the source/drains.

BRIEF SUMMARY

Additional aspects and/or advantages will be set forth in part in the description which follows and, in part, will be apparent from the description, or may be learned by practice of the invention.

A microelectronic structure includes a first nanosheet transistor that includes a first source/drain and a second source/drain. The first source/drain and the second source/drain are doped with a first material. A second nanosheet transistor that includes a third source/drain and fourth source/drain. The third source/drain and the fourth source/drain are doped with a second material. The first material and the second material are different. A placeholder is located on a backside surface of the second source/drain and the placeholder is doped with a third material. The third material is the same as the first material.

A microelectronic structure includes a first nanosheet transistor that includes a first source/drain and a second source/drain. The first source/drain and the second source/drain are doped with a first material. A second nanosheet transistor that includes a third source/drain and fourth source/drain. The third source/drain and the fourth source/drain are doped with a second material. The first material and the second material are different. The third source/drain and the fourth source/drain have different concentrations of the second material. A placeholder is located on a backside surface of the second source/drain and the placeholder is doped with a third material. The third material is the same as the first material.

A method includes the steps of forming a first source/drain and a second source/drain. The first source/drain and the second source/drain are doped with a first material. Forming a second nanosheet transistor that includes a third source/drain and fourth source/drain. The third source/drain and the fourth source/drain are doped with a second material. The first material and the second material are different. Forming a placeholder is located on a backside surface of the second source/drain and the placeholder is doped with a third material. The third material is the same as the first material.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 2 illustrates a cross section X1 of the PFET nanosheet transistor after the separation of the nano stack into multiple columns and the formation of the inner spacer, in accordance with the embodiment of the present invention.

FIG. 3 illustrates a cross section X2 of the NFET nanosheet transistor after the separation of the nano stack into multiple columns and the formation of the inner spacer, in accordance with the embodiment of the present invention.

FIG. 5 illustrates a cross section X1 of the PFET nanosheet transistor after formation of a placeholder trench, in accordance with the embodiment of the present invention.

FIG. 6 illustrates a cross section X2 of the NFET nanosheet transistor after formation of a placeholder trench, in accordance with the embodiment of the present invention.

FIG. 11 illustrates a cross section X1 of the PFET nanosheet transistor after formation of a PFET source/drain, in accordance with the embodiment of the present invention.

FIG. 12 illustrates a cross section X2 of the NFET nanosheet transistor after formation of a NFET source/drain, in accordance with the embodiment of the present invention.

FIG. 14 illustrates a cross section X1 of the PFET nanosheet transistor after formation of the gate, the frontside interlayer dielectric layer, frontside contacts, back-end-of-the-line (BEOL), and a carrier wafer, in accordance with the embodiment of the present invention.

FIG. 15 illustrates a cross section X2 of the NFET nanosheet transistor after formation of the gate, the frontside interlayer dielectric layer, frontside contacts, back-end-of-the-line (BEOL), and a carrier wafer, in accordance with the embodiment of the present invention.

FIG. 17 illustrates a cross section X1 of the PFET nanosheet transistor after flipping over the nanosheet transistor for backside processing and the removal of the first substrate, and a carrier wafer, in accordance with the embodiment of the present invention.

FIG. 18 illustrates a cross section X2 of the NFET nanosheet transistor after flipping over the nanosheet transistor for backside processing and the removal of the first substrate, in accordance with the embodiment of the present invention.

FIG. 20 illustrates a cross section X1 of the PFET nanosheet transistor after the removal of the etch stop and the second substrate and the formation of the backside interlayer dielectric layer, and a carrier wafer, in accordance with the embodiment of the present invention.

FIG. 21 illustrates a cross section X2 of the NFET nanosheet transistor after the removal of the etch stop and the second substrate and the formation of the backside interlayer dielectric layer, in accordance with the embodiment of the present invention.

FIG. 23 illustrates a cross section X1 of the PFET nanosheet transistor after formation of a lithography layer and the formation of a backside contact trench, in accordance with the embodiment of the present invention.

FIG. 24 illustrates a cross section X2 of the NFET nanosheet transistor after formation of a lithography layer and the formation of a backside contact trench, in accordance with the embodiment of the present invention.

FIG. 28 illustrates a cross section Y of the source/drain region after formation of a cap liner and a second lithography layer, and patterning of the cap liner and the second lithography layer, and after a dopant processing step, in accordance with the embodiment of the present invention.

FIG. 29 illustrates a cross section X1 of the PFET nanosheet transistor after the removal of the cap liner and the second lithography layer, and a metallization process to fill the backside contact trench and the extended backside contact trench, in accordance with the embodiment of the present invention.

FIG. 30 illustrates a cross section X2 of the NFET nanosheet transistor after the removal of the cap liner and the second lithography layer, and a metallization process to fill the backside contact trench and the extended backside contact trench, in accordance with the embodiment of the present invention.

FIG. 32 illustrates a cross section X1 of the PFET nanosheet transistor after formation of backside power rails and the formation for a backside-power-distribution-network, in accordance with the embodiment of the present invention.

FIG. 33 illustrates a cross section X2 of the NFET nanosheet transistor after formation of backside power rails and the formation for a backside-power-distribution-network, in accordance with the embodiment of the present invention.

DETAILED DESCRIPTION

Figure 1:
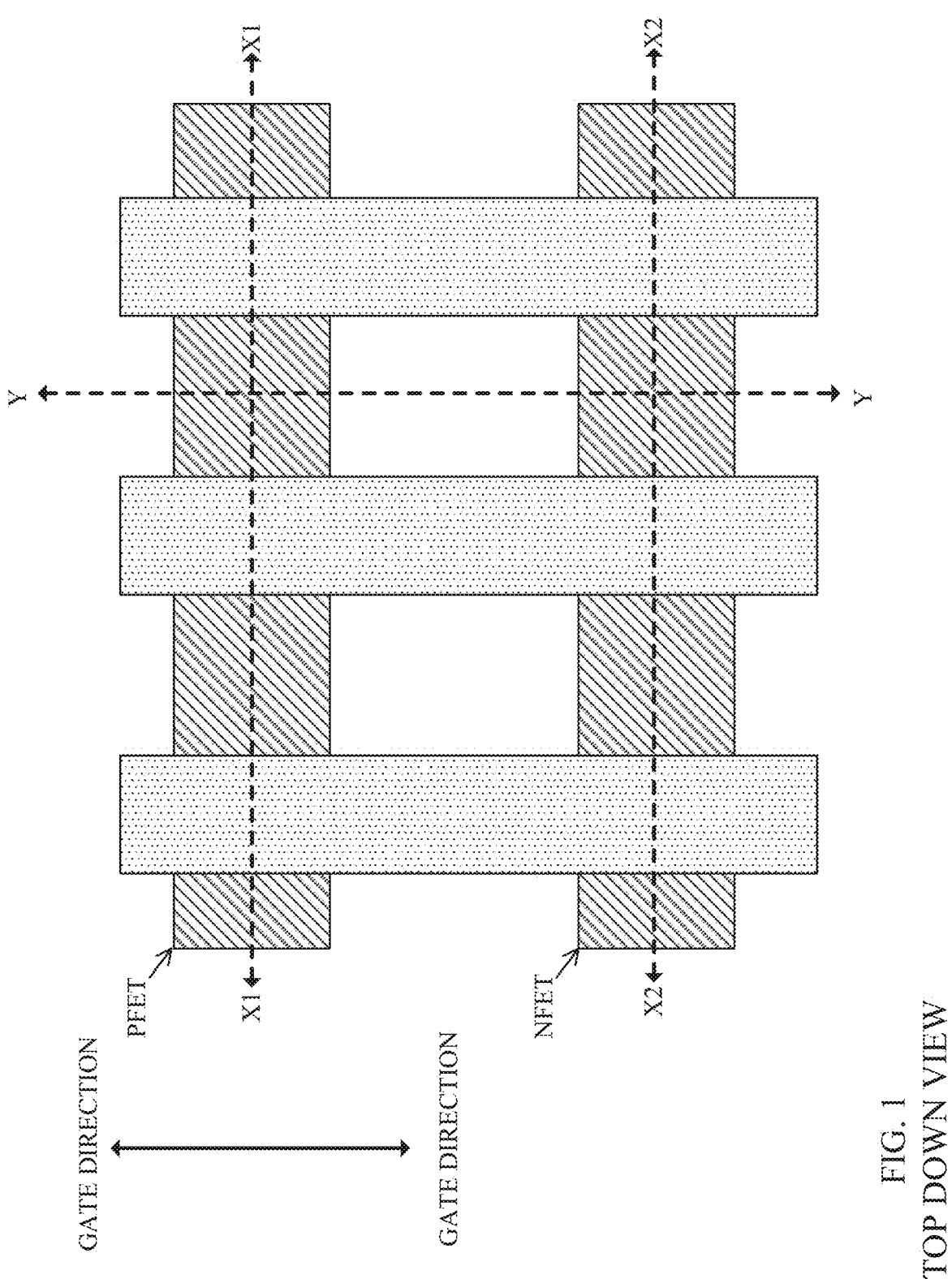
FIG. 1 illustrates a top-down view of PFET nanosheet transistors and adjacent NFET nanosheet transistors, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of +8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. Typically, a placeholder comprised of Si is located between the source/drain and the contact placeholder. This type of placeholder allows for selective removal of the p-field-effect-transistor (PFET) source/drain but has more stringent leveling and variation requirements. The present invention is directed towards forming the backside contact placeholder without the need of using a Si placeholder. By controlling the dopant of the contact placeholder allows for the removal of the placeholder while minimizing the damage to the source/drain located above the placeholder.

FIG. 1 illustrates a top-down view of multiple devices, in accordance with the embodiment of the present invention. The cross-section X1 extends horizontally through p-field-effect-transistor (PFET) nanosheet transistors. The cross-section X2 extends horizontally through n-field-effect-transistor (NFET) nanosheet transistors. Cross section Y is perpendicular to cross section X1 and X2, where cross section Y is through a source/drain region that spans across PFET nanosheet transistors and the NFET nanosheet transistors. Cross-sections X1 and X2 are perpendicular to the gate direction and cross-section Y is parallel to the gate direction.

Figures 2, 3:
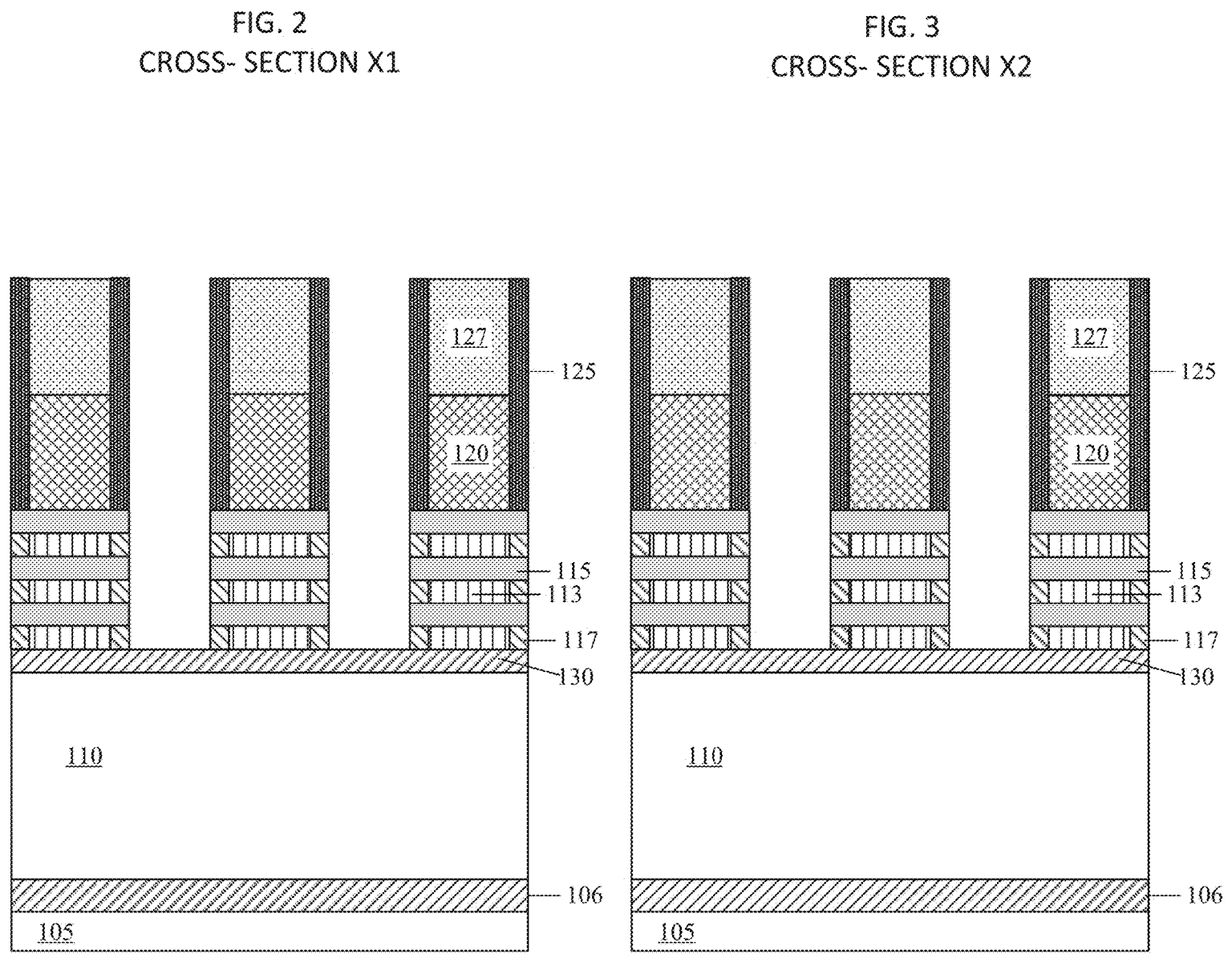
Figure 4:
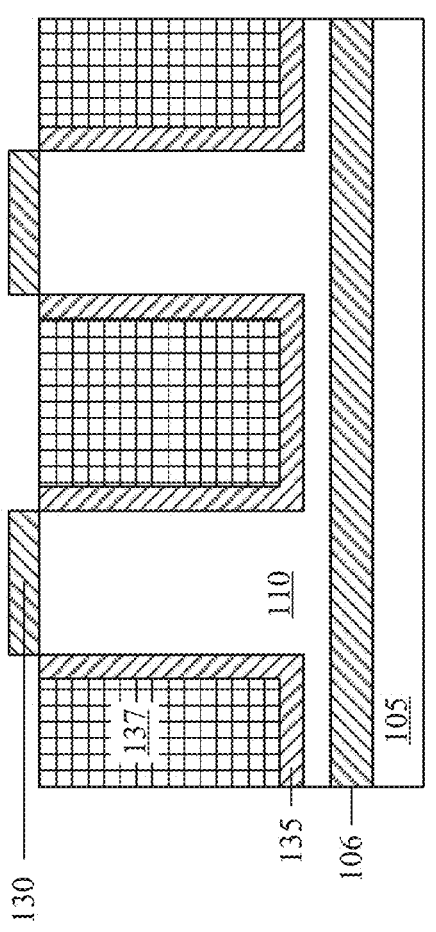
FIG. 4 illustrates a cross section Y of the source/drain region after the separation of the nano stack into multiple columns and the formation of the inner spacer, in accordance with the embodiment of the present invention.

Referring now to FIGS. 2, 3, and 4, a structure is shown during an intermediate step of a method of fabricating stacked nano devices, such as, a stacked nanosheet transistor structure after separation of the nano stack into multiple columns and the formation of the inner spacer, according to an embodiment of the invention.

FIGS. 2, 3, and 4 illustrate the processing stage after the separation of the nano stack into multiple columns and the formation of the inner spacer.

FIG. 2 illustrates the PFET nanosheet transistors and FIG. 3 illustrates the NFET nanosheet transistor that includes a first substrate 105, an etch stop 106, a second substrate 110, a bottom dielectric isolation layer 130, a plurality of nanosheet columns. The nanosheet columns are comprised of a plurality of channel layers 115, a plurality of sacrificial layers 113, an inner spacer 117, an upper spacer 125, a dummy gate 120, and a hardmask 127. The plurality of channel layers 115 can be comprised of, for example, Si. The plurality of sacrificial layers 113 can be comprised of SiGe, where Ge is in the percentage of 15 to 35%.

The first substrate 105 and the second substrate 110 can be, for example, a material including, but not necessarily limited to, silicon (Si), silicon germanium (SiGe), Si: C (carbon doped silicon), carbon doped silicon germanium (SiGe: C), III-V, II-V compound semiconductor or another like semiconductor. In addition, multiple layers of the semiconductor materials can be used as the semiconductor material of the first substrate 105 and the second substrate 110. In some embodiments, first substrate 105 and the second substrate 110 includes both semiconductor materials and dielectric materials. The semiconductor first substrate 105 and the second substrate 110 may also comprise an organic semiconductor or a layered semiconductor such as, for example, Si/SiGe, a silicon-on-insulator or a SiGe-on-insulator. A portion or the entire semiconductor first substrate 105 and the second substrate 110 may also be comprised of an amorphous, polycrystalline, or monocrystalline. The semiconductor first substrate 105 and the second substrate 110 may be doped, undoped or contain doped regions and undoped regions therein.

FIG. 4 illustrates the source/drain region, where trenches were formed in the second substrate 110 when the alternating stack was separated into a plurality of columns. These trenches are filled with a liner 135 and a shallow trench isolation layer 137.

Figures 5, 6:
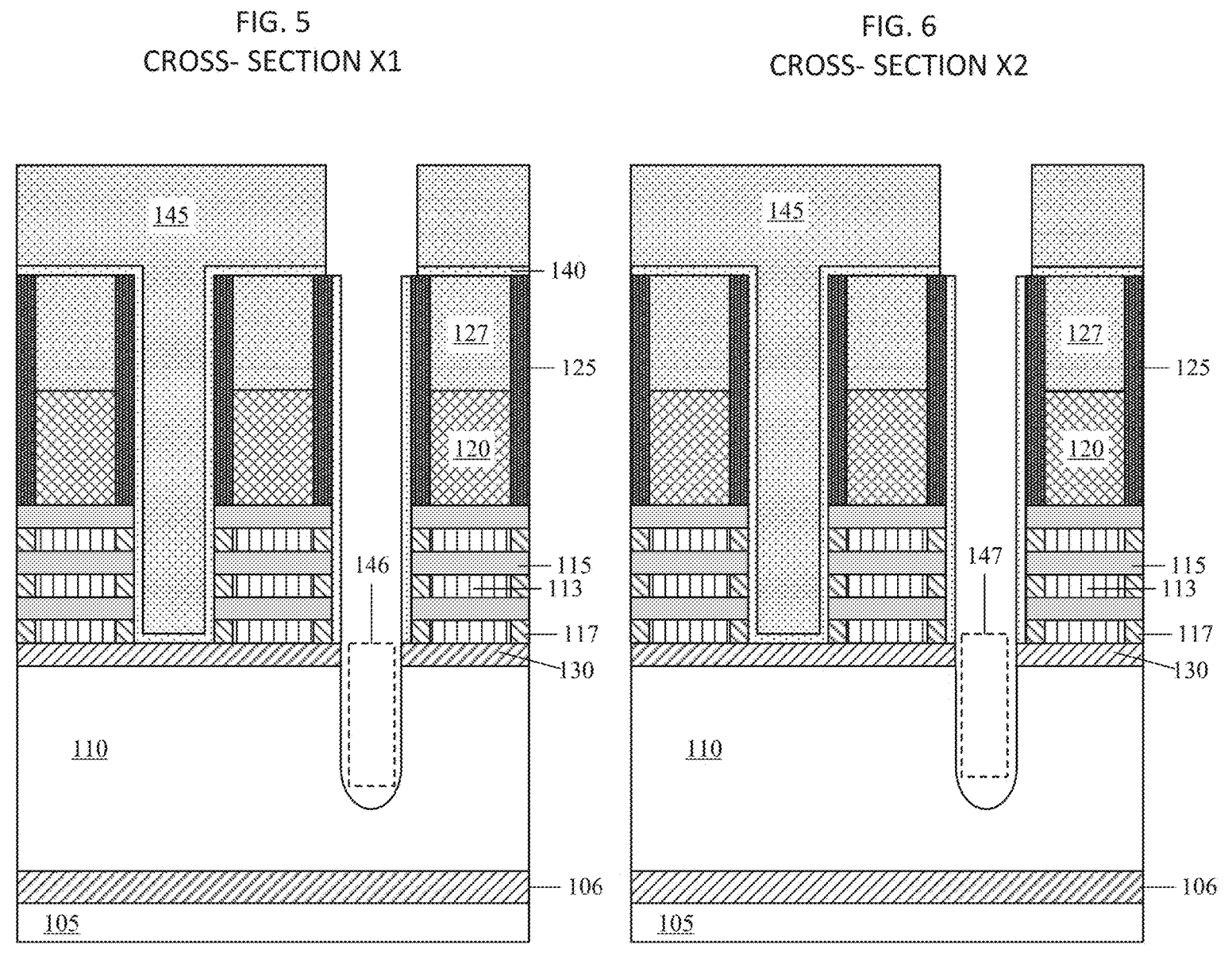
Figure 7:
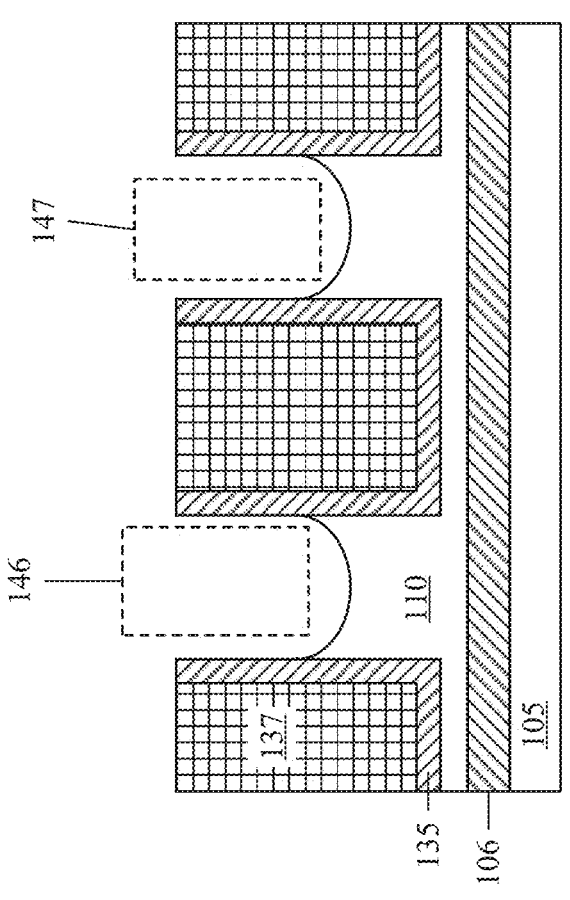
FIG. 7 illustrates a cross section Y of the source/drain region after formation of a placeholder trench, in accordance with the embodiment of the present invention.

FIGS. 5, 6, and 7 illustrate the processing stage after formation of a placeholder trenches 146, 147. A sacrificial liner 140 is formed on the exposed surfaces, such that, the sacrificial liner 140 is located on exposed surfaces of the nanosheet columns and the bottom dielectric isolation layer 130. A first lithography layer 145 is formed on top of the sacrificial liner 140. The first lithography layer 145 is patterned and a placeholder trench 146, 147 are formed in the second substrate 110 in the source/drain region of the nanosheet transistors.

Figures 8, 9:
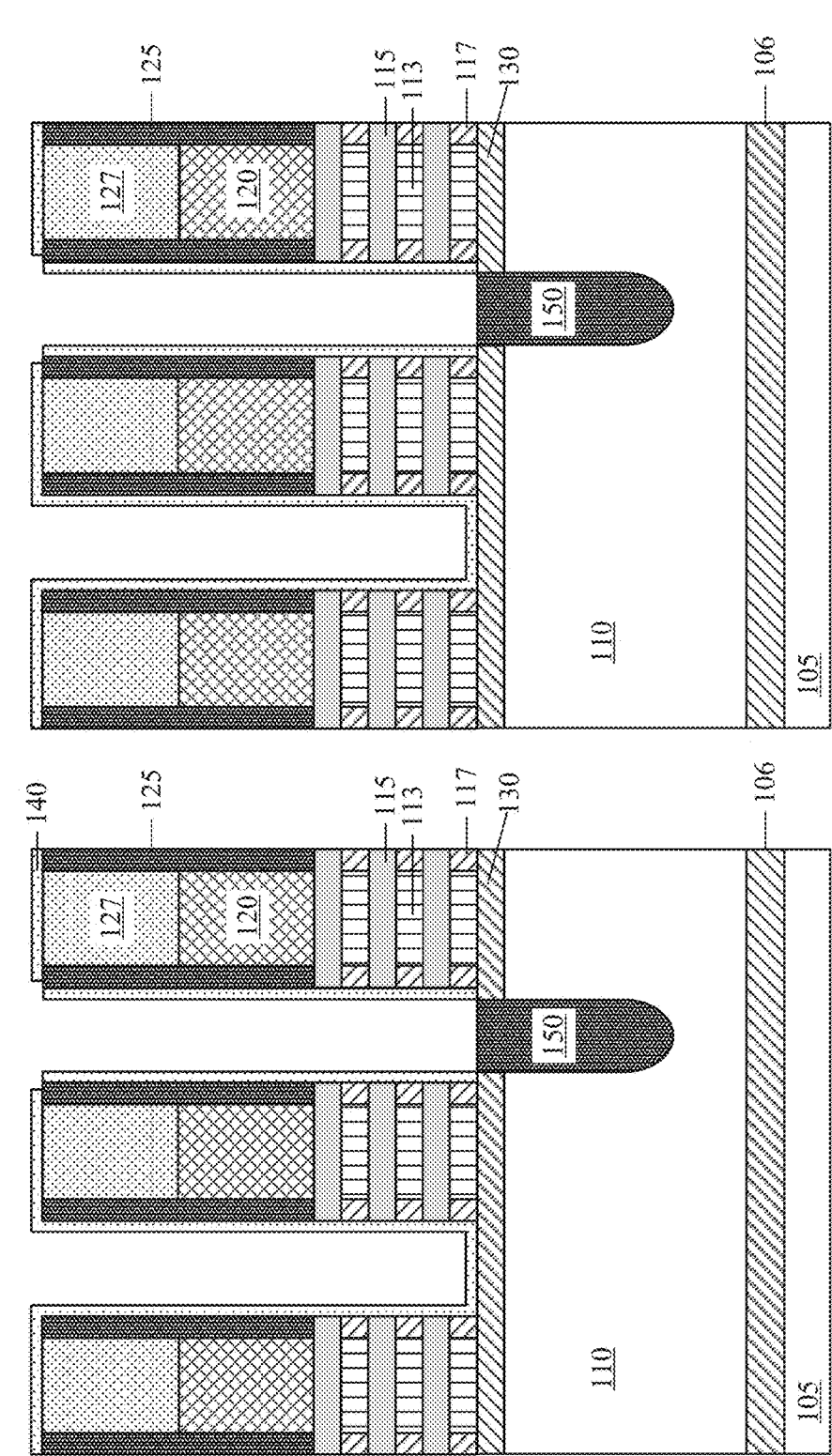
FIG. 8 illustrates a cross section X1 of the PFET nanosheet transistor after formation of a placeholder, in accordance with the embodiment of the present invention.
FIG. 9 illustrates a cross section X2 of the NFET nanosheet transistor after formation of a placeholder, in accordance with the embodiment of the present invention.
Figure 10:
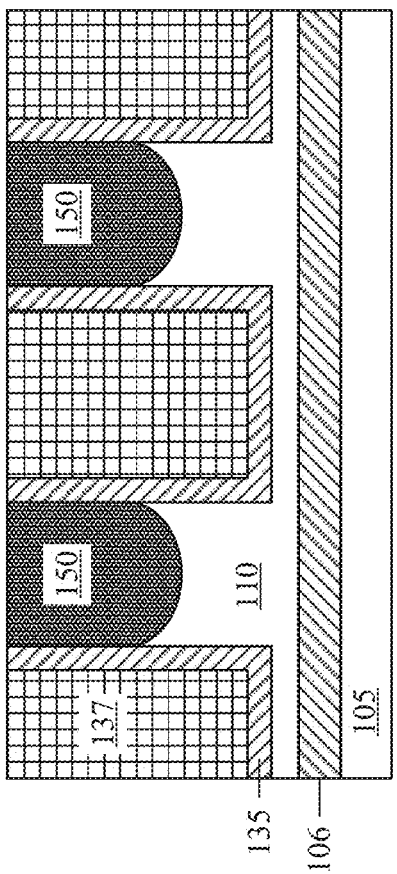
FIG. 10 illustrates a cross section Y of the source/drain region after formation of a placeholder, in accordance with the embodiment of the present invention.

FIGS. 8, 9, and 10 illustrate the processing stage after formation of a placeholder 150. The placeholder trenches 146, 147 are filed with a material to form placeholder 150. The material of the placeholder 150 can be, for example, SiGe: B. Placeholder 150 utilizes a Boran (B) dopant in the material to allow for difference in the dopant material from the dopant utilized in one of the source/drains. A different dopant can be utilized, such as, Phosphorous (P) in placeholder 150. The type of dopant used will determine which of the placeholders 150 under the different source/drains (N or P type) that will be removed for a backside contact.

Figure 13:
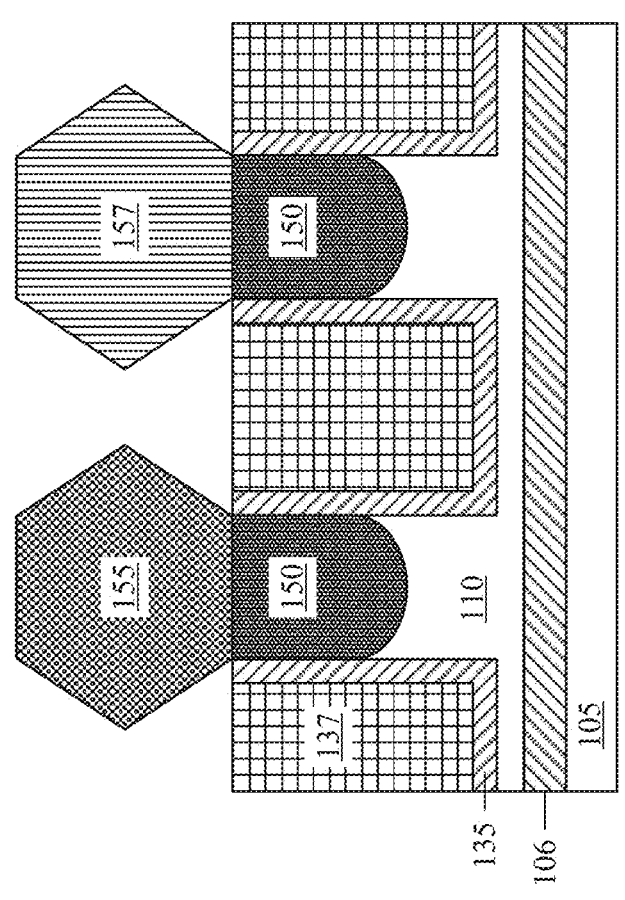
FIG. 13 illustrates a cross section Y of the source/drain region after formation of a PFET and NFET source/drains, in accordance with the embodiment of the present invention.

FIGS. 11, 12, and 13 illustrate the processing stage after formation of a PFET and NFET source/drains 155, 157. The sacrificial liner 140 is removed to expose the surfaces of the nanosheet columns for the epitaxial growth of the source/drain materials. The PFET source/drains 155 are located between nanosheet columns on the PFET nanosheet transistor and NFET source/drains 157 are located between nanosheet columns on the NFET nanosheet transistor. The placeholder 150 is comprised of, for example, SiGe: B, meaning that the placeholder 150 is doped with boron (B). The NFET source/drain 157 can include a dopant comprised of phosphorous (P), thus the NFET source/drain 157 has a different dopant than that of the placeholder 150.

The PFET and NFET source/drains 155, 157 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figure 16:
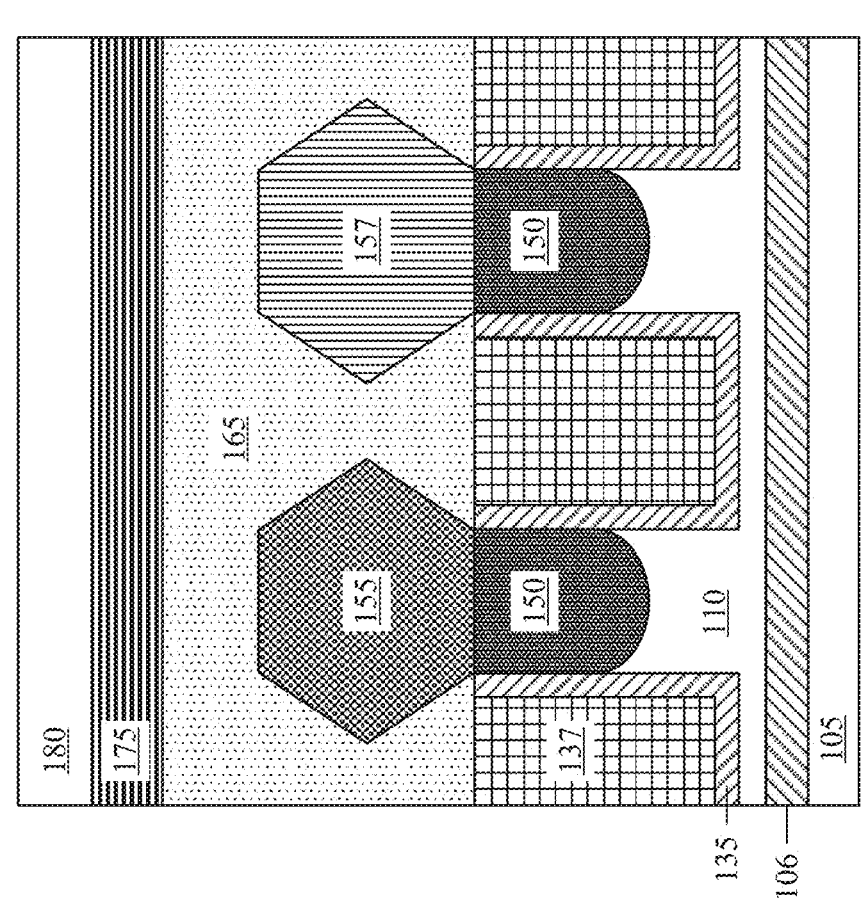
FIG. 16 illustrates a cross section Y of the source/drain region after formation of the gate, the frontside interlayer dielectric layer, frontside contacts, back-end-of-the-line (BEOL), and a carrier wafer, in accordance with the embodiment of the present invention.

FIGS. 14, 15, and 16 illustrate the processing stage after formation of gate 160, the frontside interlayer dielectric layer 165, frontside contacts 170, 172, back-end-of-the-line (BEOL) layer 175, and a carrier wafer 180. A frontside interlayer dielectric layer 165 is formed on top of the PFET source/drain 155 and on top of the NFET source/drain 157. Hardmask 127, dummy gate 120 and the sacrificial layers 113 are removed to create empty spacer around the channel layers 115. Gate 160 is formed in this empty space. Gate 160 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W.

Additional frontside interlayer dielectric material is added to extend the frontside interlayer dielectric layer 165 on top of the gate 160 and on top of the upper spacer 125. Trenches (not shown) are formed in the frontside interlayer dielectric layer 165 and filled with a conductive metal to form frontside contacts 170, 171. Frontside contacts 170, 171 connect to a frontside surface of the PFET source/drain 155 and the NFET source/drain 157, respectively. A back-end-of-the-line (BEOL) layer 175 is formed on top of the frontside interlayer dielectric layer 165 and on top of the frontside contacts 170, 171. A carrier wafer 180 is located on top of the BEOL layer 175. The carrier wafer 180 allows for the PFET nanosheet transistors/NFET nanosheet transistors to be flipped over for backside processing. FIGS. 12-16 illustrated the frontside processing of the nanosheet transistors and FIGS. 7-31 illustrate the backside processing of the nanosheet transistors.

Figures 17, 18:
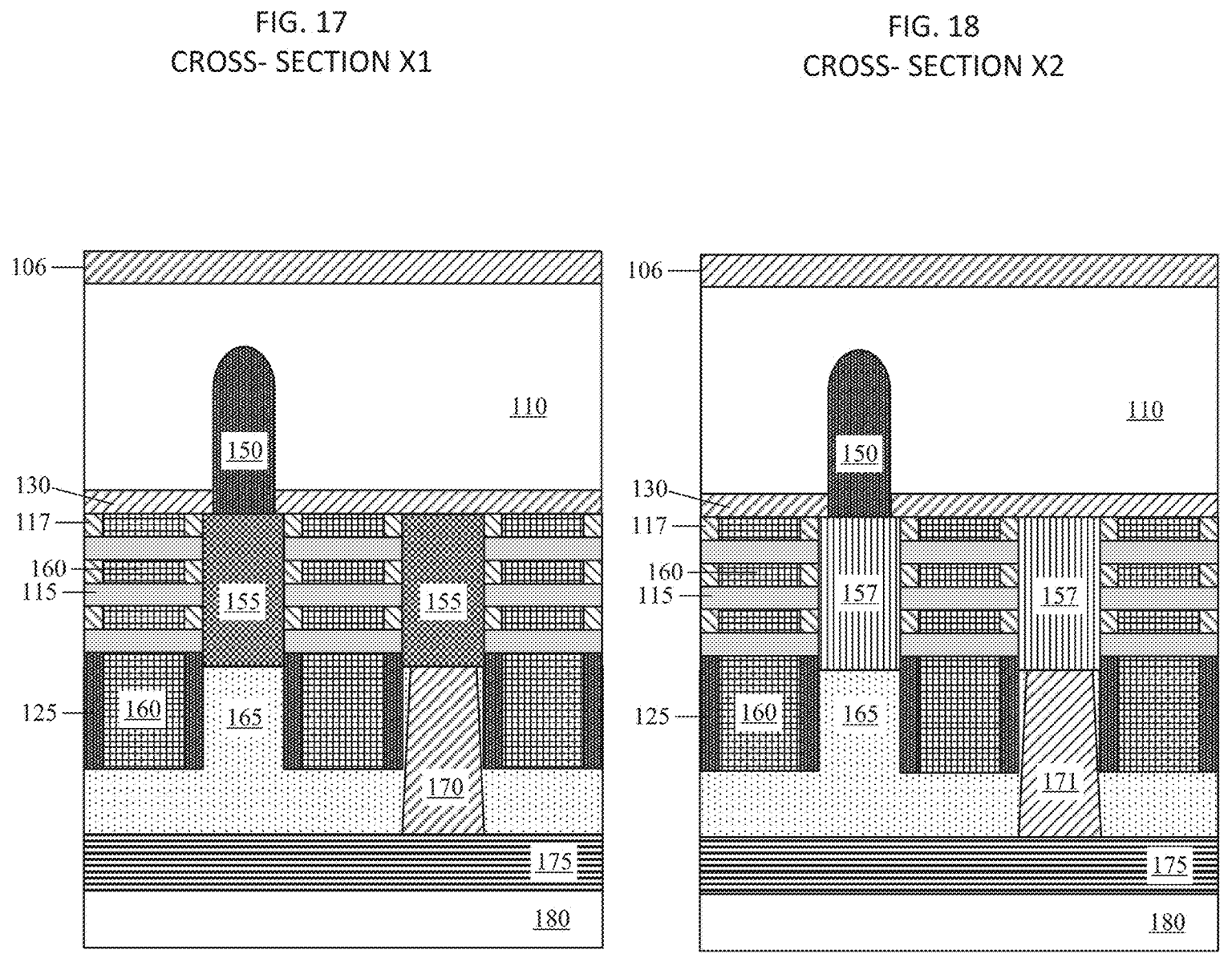
Figure 19:
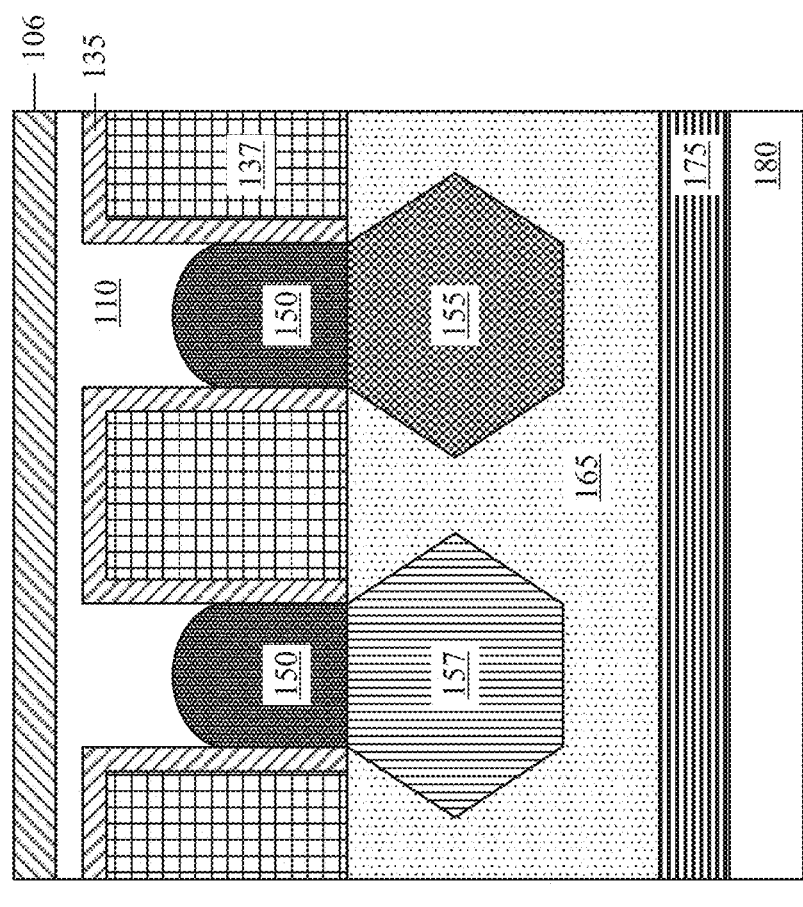
FIG. 19 illustrates a cross section Y of the source/drain region after flipping over the nanosheet transistor for backside processing and the removal of the first substrate, in accordance with the embodiment of the present invention.

FIGS. 17, 18, and 19 illustrate the processing stage after flipping over the nanosheet transistors for backside processing and the removal of the first substrate 105. The PFET and the NFET nanosheet transistors are flipped over, which exposes the backside of the nanosheet transistors for processing. The first substrate 105 is removed to expose a backside surface of the etch stop 106.

Figures 20, 21:
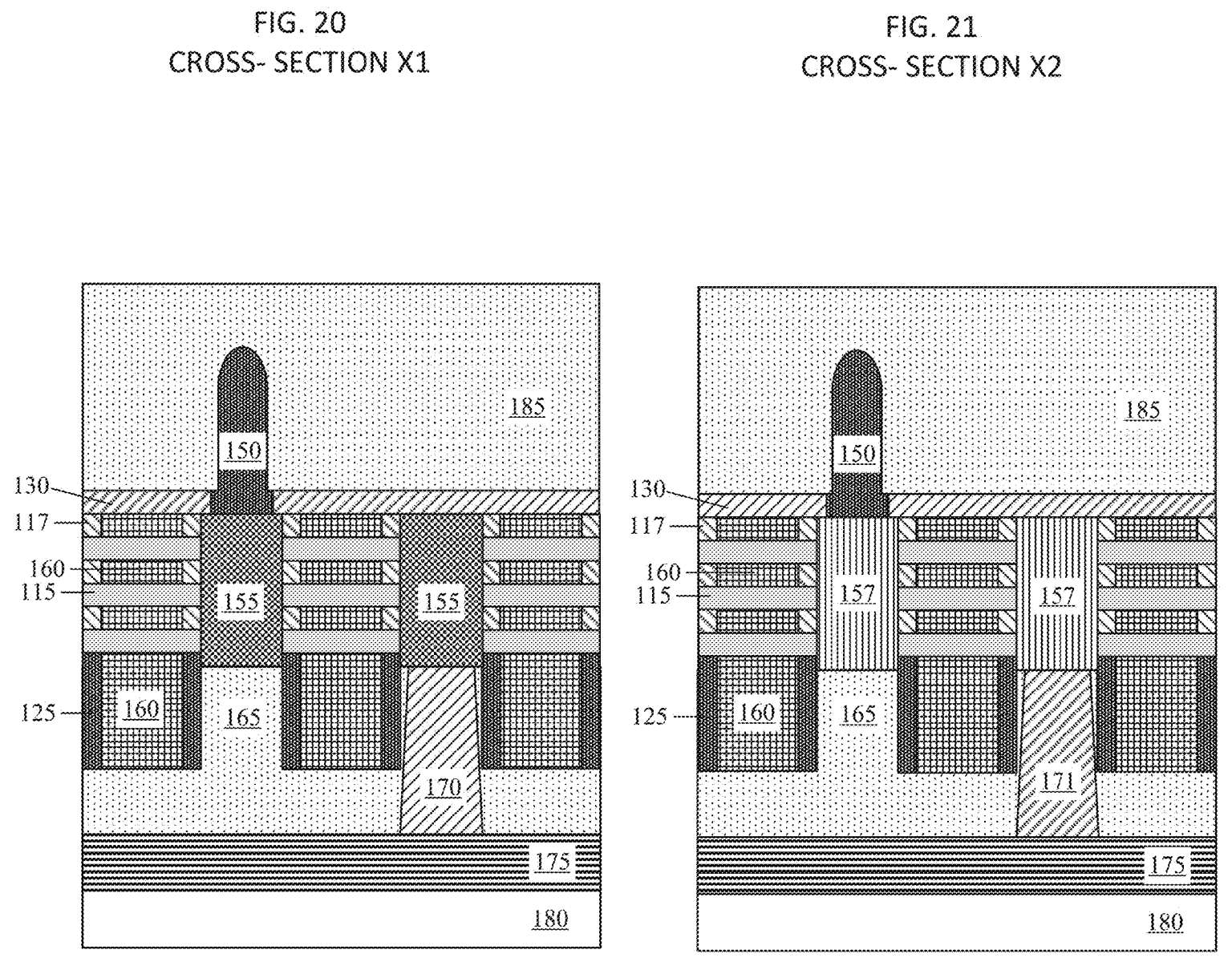
Figure 22:
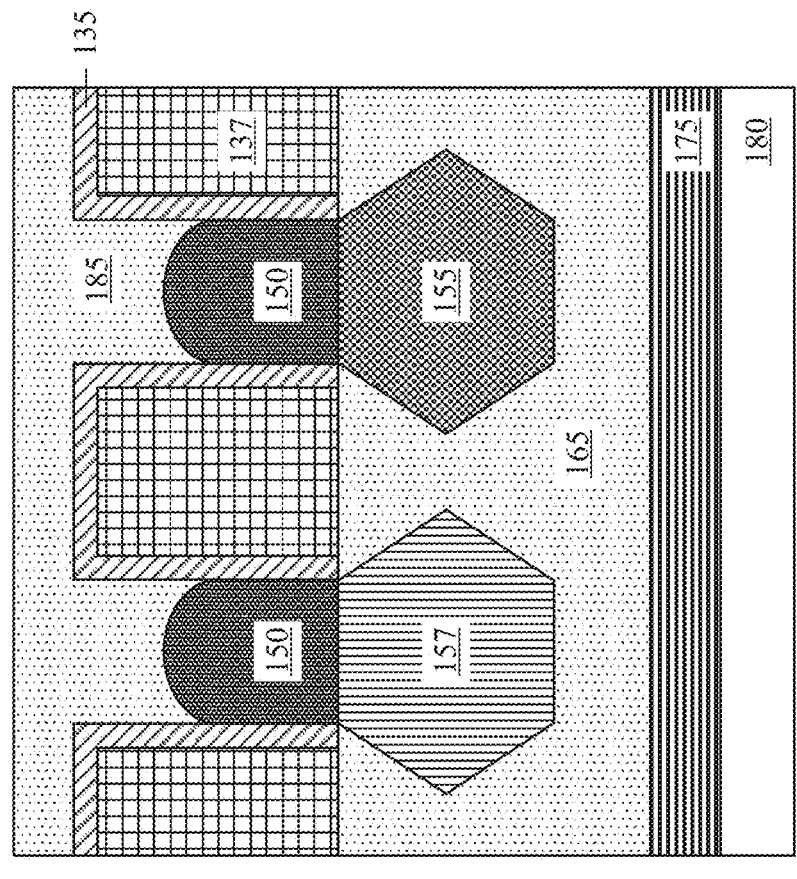
FIG. 22 illustrates a cross section Y of the source/drain region after the removal of the etch stop and the second substrate and the formation of the backside interlayer dielectric layer, in accordance with the embodiment of the present invention.

FIGS. 20, 21, and 22 illustrate the processing stage after the removal of the etch stop 106 and the second substrate 110 and the formation of the backside interlayer dielectric layer 185. The etch stop 106 and the second substrate 110 are removed. The removal of the second substrate 110 can cause a thinning/etching of the placeholder 150. A backside interlayer dielectric layer 185 is formed on the backside surface of the bottom dielectric isolation layer 130. The backside interlayer dielectric layer 185 encloses the placeholder 150 that was exposed by the removal of the second substrate 110. FIG. 22 illustrates that the backside interlayer dielectric layer 185 is formed on the backside surface of liner 135 and on top of the placeholder 150.

Figures 23, 24:
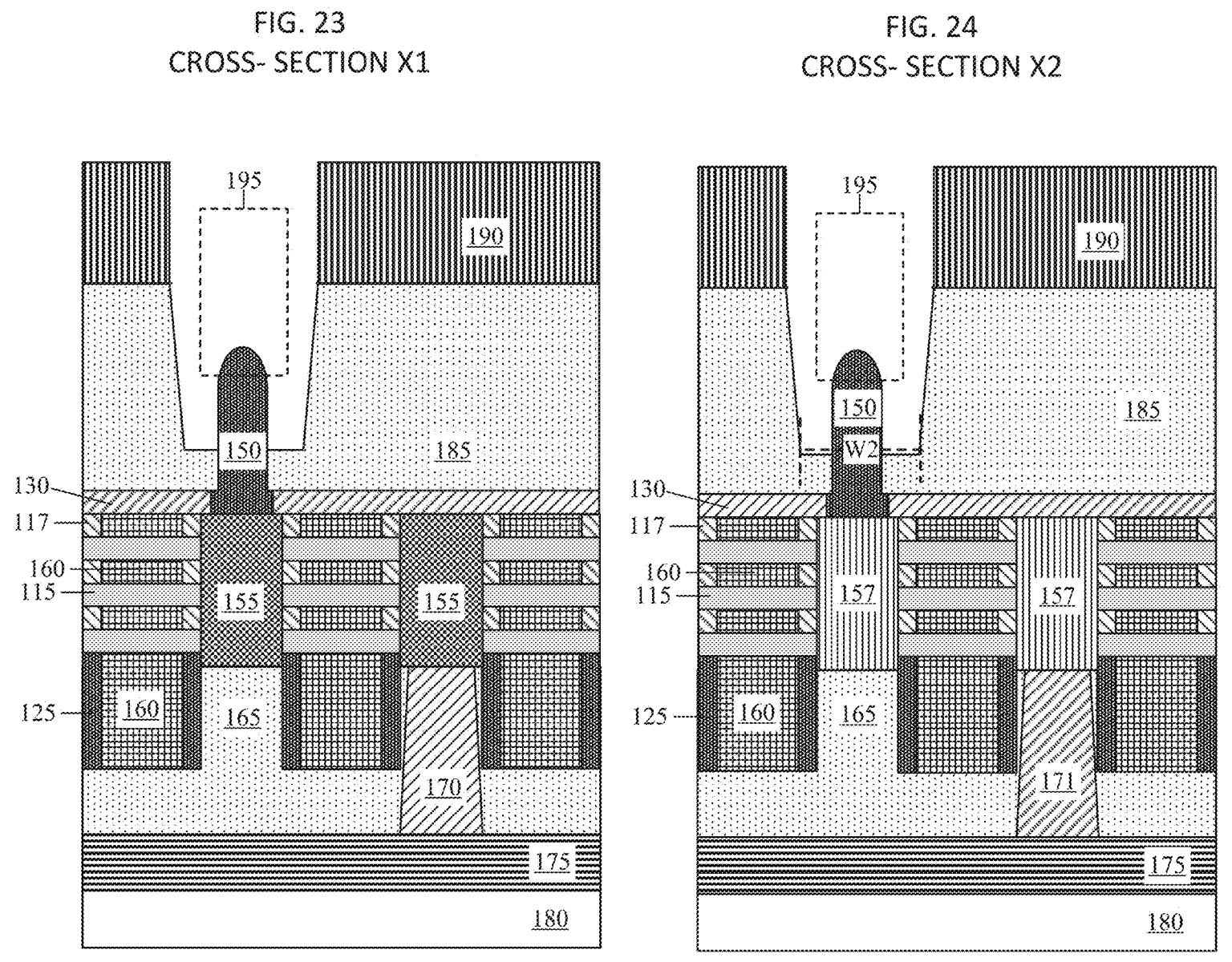
Figure 25:
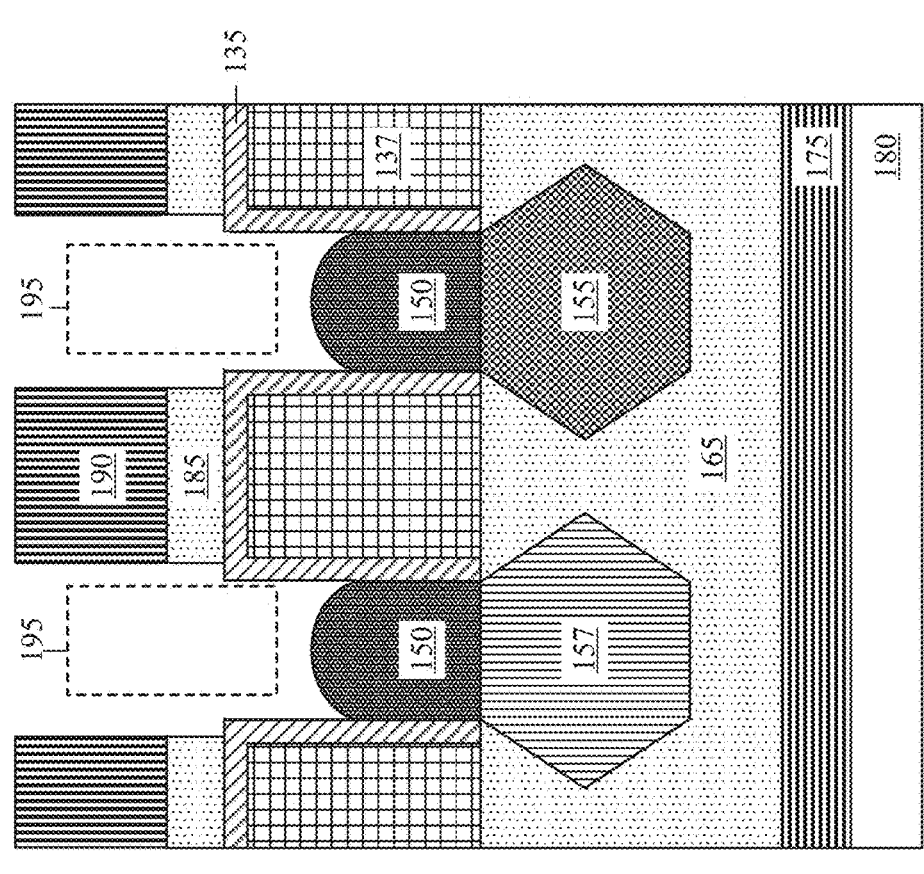
FIG. 25 illustrates a cross section Y of the source/drain region after formation of a lithography layer and the formation of a backside contact trench, in accordance with the embodiment of the present invention.

FIGS. 23, 24, and 25 illustrate the processing stage after formation of a first lithography layer 190 and the formation of a backside contact trench 195. The first lithography layer 190 is formed on top of the backside interlayer dielectric layer 185. The first lithography layer 190 and the backside interlayer dielectric layer 185 are patterned to form the backside contact trench 195. The backside contact trench 195 exposes a portion of the placeholder 150.

Figures 26, 27:
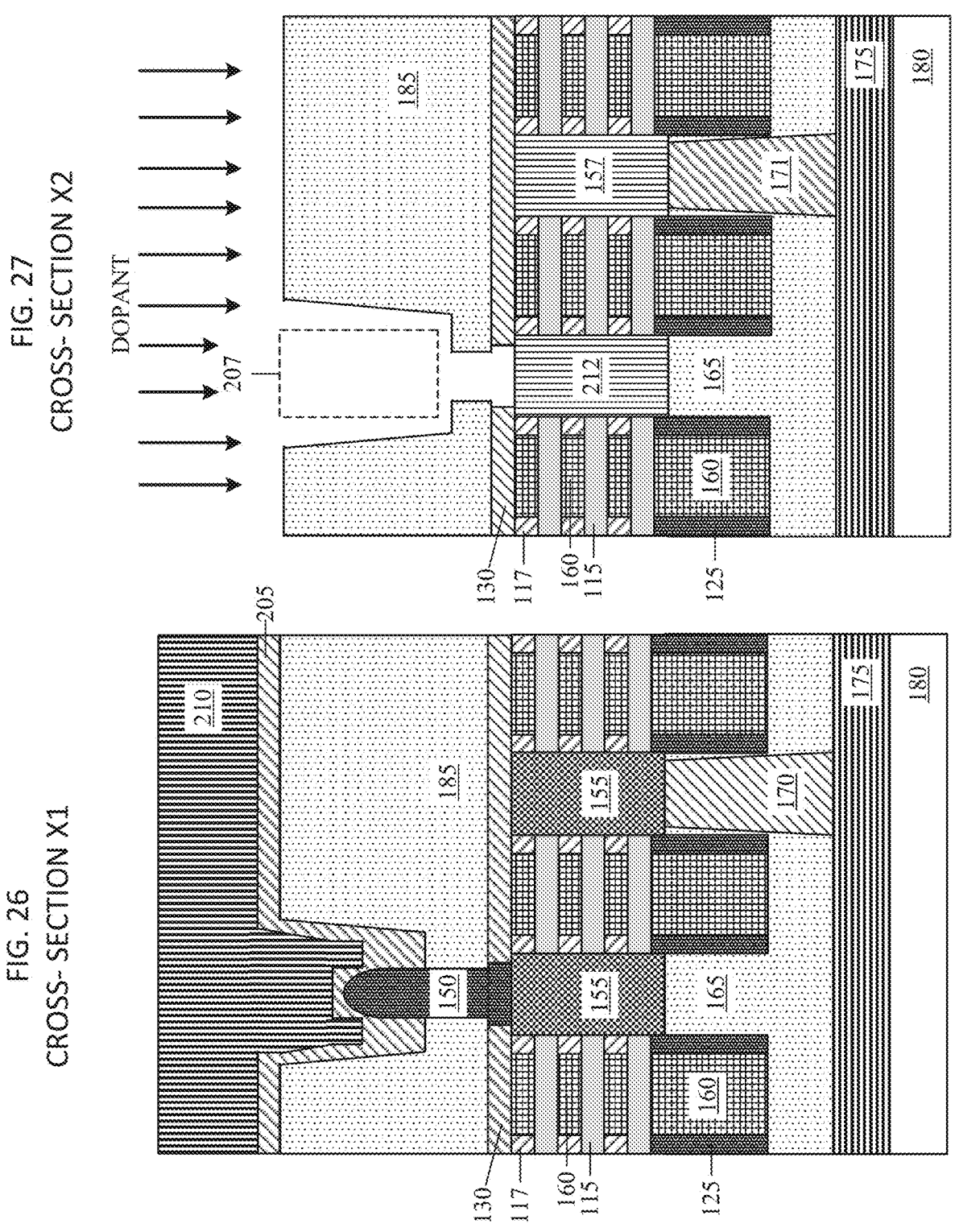
FIG. 26 illustrates a cross section X1 of the PFET nanosheet transistor after formation of a cap liner and a second lithography layer, and patterning of the cap liner and the second lithography layer, and after a dopant processing step, in accordance with the embodiment of the present invention.
FIG. 27 illustrates a cross section X2 of the NFET nanosheet transistor after formation of a cap liner and a second lithography layer, and patterning of the cap liner and the second lithography layer, and after a dopant processing step, in accordance with the embodiment of the present invention.
Figure 28:
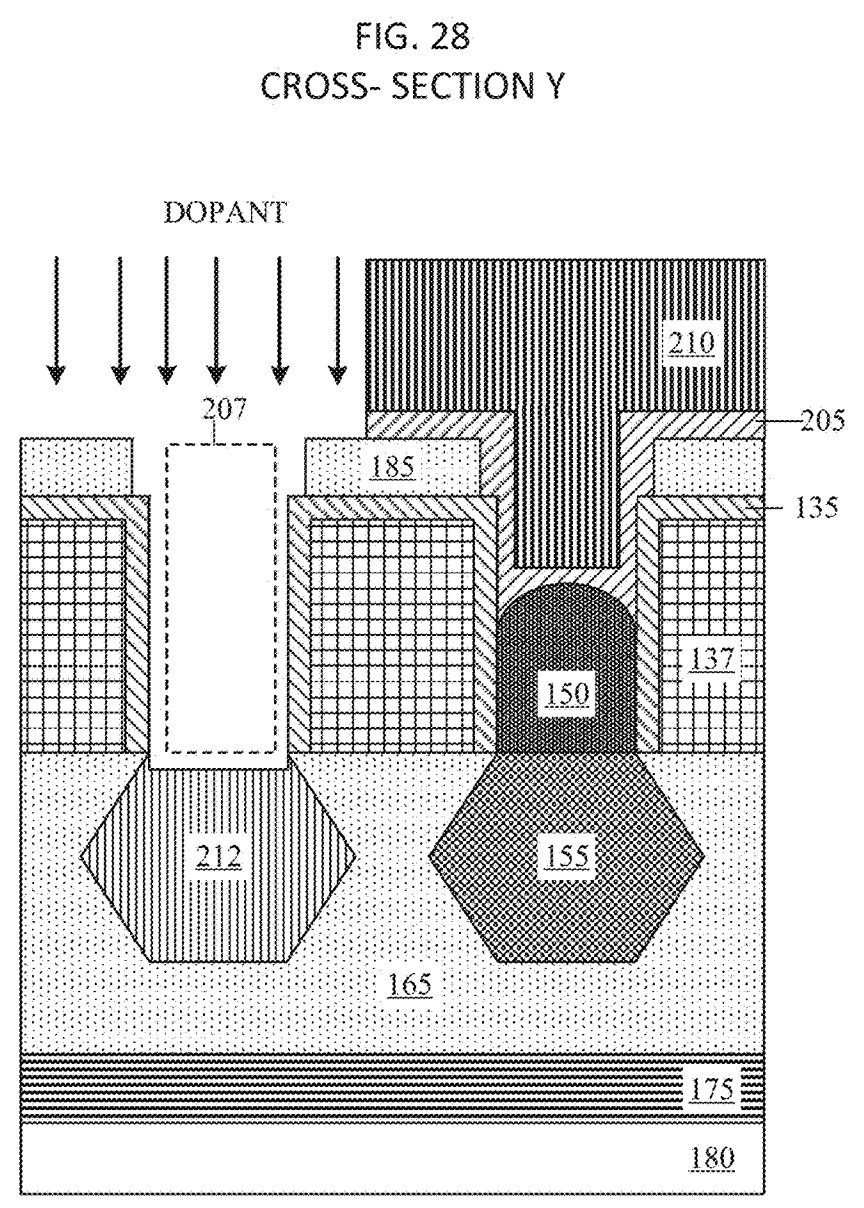

FIGS. 26, 27, and 28 illustrate the processing stage after formation of a cap liner 205 and a second lithography layer 210, and patterning of the cap liner 205 and the second lithography layer 210, and after a dopant processing step. Cap liner 205 is formed on the backside surface of the backside interlayer dielectric layer 185, such that the cap liner 205 forms along the boundaries of the backside contact trench 195. The cap liner 205 can be comprised of, for example, SiN. The second lithography layer 210 is formed on top of cap liner 205. The second lithography layer 210 and the cap liner 205 are patterned to expose the placeholder 150 located in the NFET device. The second lithography layer 210 and the cap liner 205 prevent the placeholder 150 in the PFET device from being removed during the removal process of the placeholder 150 in the NFET device. Since the placeholder 150 and the source/drain 155 of the PFET device utilizes the same dopant (boron (B)), then the removal process of the placeholder 150 would damage the PFET source/drain 155. Placeholder 150 in the NFET device is removed without damaging the underlying NFET source/drain 157 because of the dopant difference between NFET source/drain 157 and the placeholder 150 allows for a selection of an etching process directed towards the dopant of the placeholder 150. As described above, the placeholder 150 can be comprised of SiGe: B, which allows for selecting a etching of the placeholder 150 without damaging the NFET source/drain 157, that includes a dopant such as phosphorus (P). Thus, the removal of the placeholder 150 exposes the backside surface of one of the NFET source/ drains 157, thus creating the extended backside contact trench 207. After the NFET source/drain 157 is exposed a dopant processing can be applied to NFET source/drain 157 to implant additional dopant material to form doped NFET source/drain 212. Therefore, the NFET device has NFET source/drain 157 having a first dopant concentration and doped NFET source/drain 212 having a second dopant concentration, where the second dopant concentration is greater than the first dopant concentration.

Figures 29, 30:
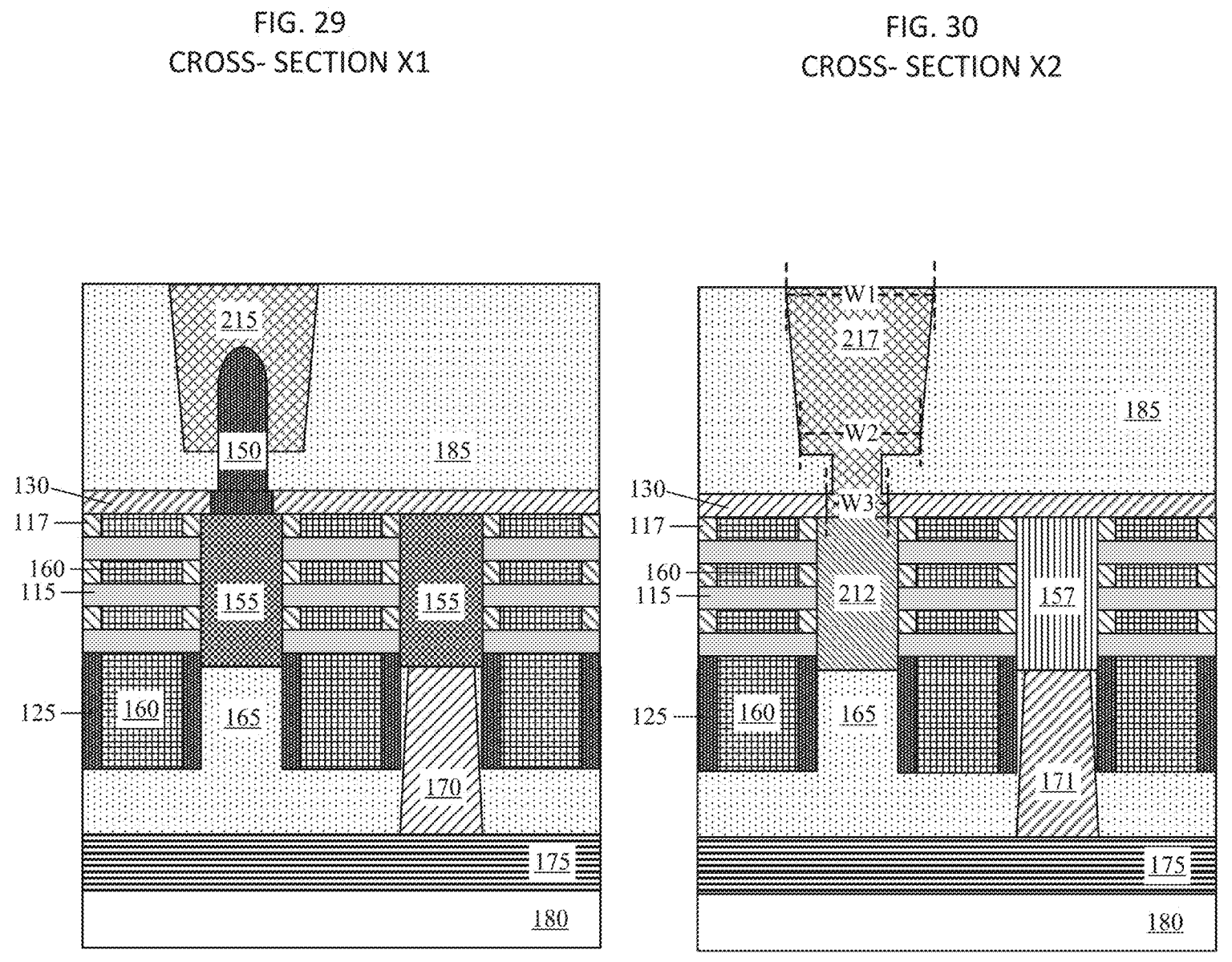
Figure 31:
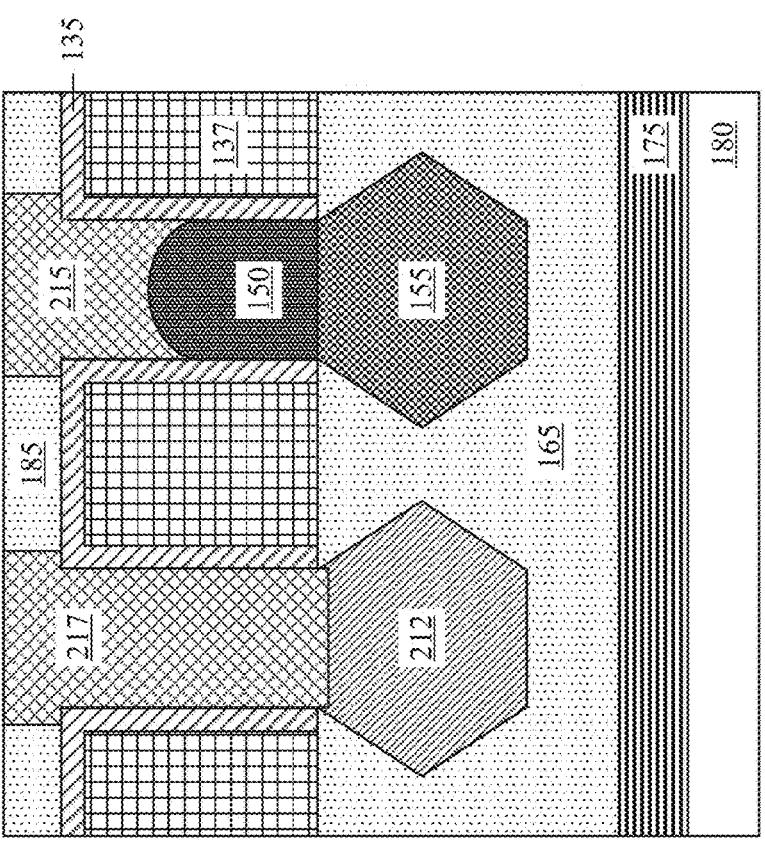
FIG. 31 illustrates a cross section Y of the source/drain region after the removal of the cap liner and the second lithography layer, and a metallization process to fill the backside contact trench and the extended backside contact trench, in accordance with the embodiment of the present invention.

FIGS. 29, 30, and 31 illustrate the processing stage after the removal of the cap liner 205 and the second lithography layer 210, and a metallization process to fill the backside contact trench 195 and the extended backside contact trench 207. The second lithography layer 210 and the cap liner 205 are removed. The removal of these layers also empties/ hallows outs the backside contact trench 195. A metallization process occurs filling the backside contact trench 195 and the extended backside contact trench 207 with a conductive metal. A first backside contact 215 is formed in the backside contact trench 195. The first backside contact 215 is in contact with a backside surface of placeholder 150 located beneath the PFET source/drain 155. Since the placeholder 150 can be comprised of SiGe: B and the PFET source/drain can also be comprised of SiGe: B allows for the placeholder 150 to provide a connection between the first backside contact 215 and the PFET source/drain 155.

The second backside contact 217 is formed in the extended backside contact trench 207. The second backside contact 217 is in contact with a backside surface of the doped NFET source/drain 212. The second backside contact 217 has a varying width. The top portion (or the portion farthest away from the doped NFET source/drain 212) is the widest portion of the second backside contact 217. The top portion has a width W1. The middle width W2 (i.e., the width of the bottom portion of the backside contact trench 195, as illustrated in FIG. 24) of the second backside contact 217 is smaller than the top width W1. The contact width W3 (i.e., the portion of the second backside contact 217 that is in contact with the backside surface of the doped NFET source/drain 212) is smaller than the middle width W2. Therefore, the critical dimension of the second backside contact 217 has the following relationship W1>W2>W3.

Figures 32, 33:
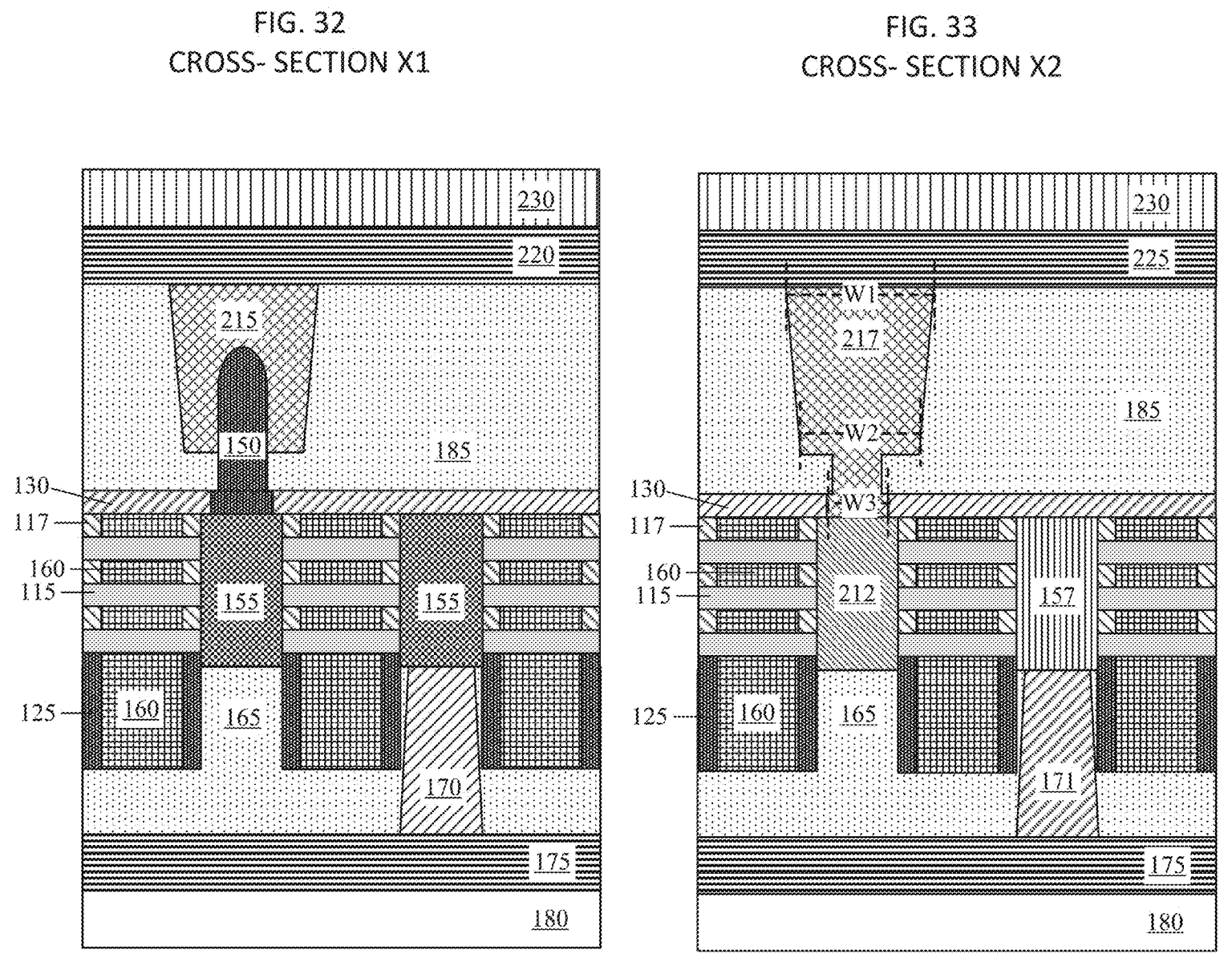
Figure 34:
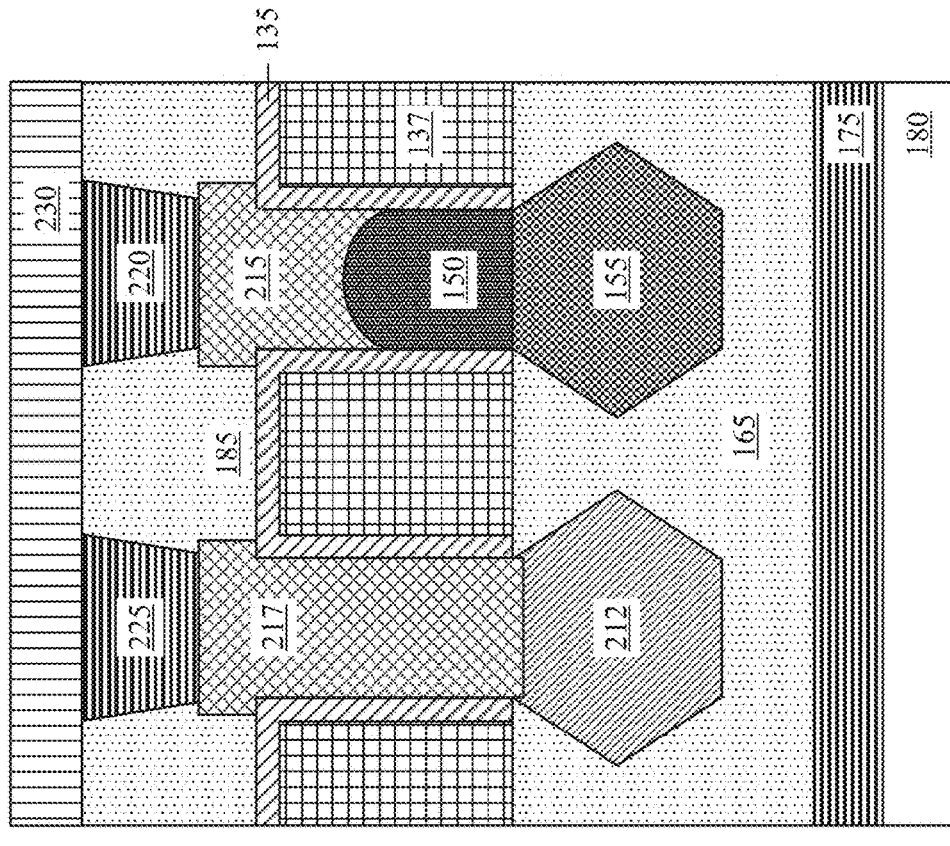
FIG. 34 illustrates a cross section Y of the source/drain region after formation of backside power rails and the formation for a backside-power-distribution-network, in accordance with the embodiment of the present invention.

FIGS. 32, 33, and 34 illustrate the processing stage after formation of backside power rails 220, 225 and the formation for a backside-power-distribution-network (BSPDN) 230. A first power rail 220 is formed on the backside surface of the backside interlayer dielectric layer 185 and on the backside surface of the first backside contact 215. The first power rail 220 can be for example, a Vdd power rail. A second power rail 225 is formed on the backside surface of the backside interlayer dielectric layer 185 and on the backside surface of the second backside contact 217. The second power rail 225 can be for example, a Vss power rail. BSPDN 230 is formed on top of the first and second power rails 220, 225, and on top of the backside interlayer dielectric layer 185.

A microelectronic structure includes a first nanosheet transistor (PFET transistor) that includes a first source/drain 155 and a second source/drain 155. The first source/drain 155 and the second source/drain 155 are doped with a first material (e.g., boron (B)). A second nanosheet transistor (NFET) that includes a third source/drain 157 and fourth source/drain 212. The third source/drain 157 and the fourth source/drain 212 are doped with a second material (e.g., phosphorus (P)). The first material and the second material are different. A placeholder 150 is located on a backside surface of the second source/drain 155 and the placeholder 150 is doped with a third material (SiGe: B). The third material is the same as the first material (e.g., boron (B)).

The first material is boron (B) and the second material is phosphorous (P). Alternatively, the first material is phosphorous (P) and the second material is boron (B). A backside contact 215 in direct contact with the placeholder 150, wherein the placeholder provides an electrical connection between the second source/drain 155 and backside contact 215.

A backside contact 217 that is connected to the backside surface of the fourth source/drain 212. A top surface of the backside contact 217 has a first width W1, a middle section of the backside contact 217 has a second width W2, and a bottom section of the backside contact 217 has a third width W3. The first width, second width, and the third width are all different. The first width W1 is larger than the second width W2 and the third width W3, and the second width W2 is larger than the third width W3.

A microelectronic structure includes a first nanosheet transistor (PFET transistor) that includes a first source/drain 155 and a second source/drain 155. The first source/drain 155 and the second source/drain 155 are doped with a first material (e.g., boron (B)). A second nanosheet transistor (NFET) that includes a third source/drain 157 and fourth source/drain 212. The third source/drain 157 and the fourth source/drain 212 are doped with a second material (e.g., phosphorus (P)). The first material and the second material are different. The third source/drain 157 and the fourth source/drain 212 have different concentrations of the second material. A placeholder 150 is located on a backside surface of the second source/drain 155 and the placeholder 150 is doped with a third material (SiGe: B). The third material is the same as the first material (e.g., boron (B)).

The first material is boron (B) and the second material is phosphorous (P). Alternatively, the first material is phosphorous (P) and the second material is boron (B).

The dopant concentration of the second material (e.g., phosphorous (P)) in the fourth source/drain 212 is higher than the dopant concentration of the second material in the third source/drain 157.

A backside contact 217 that is connected to the backside surface of the fourth source/drain 212. A top surface of the backside contact 217 has a first width W1, a middle section of the backside contact 217 has a second width W2, and a bottom section of the backside contact 217 has a third width W3. The first width, second width, and the third width are all different. The first width W1 is larger than the second width W2 and the third width W3, and the second width W2 is larger than the third width W3. The backside contact 217 has a T-shape/bolt profile through a cross-section that passes through the second source/drain 155 and the fourth source/drain 217.

A method includes the steps of forming a first source/drain 155 and a second source/drain 155. The first source/drain 155 and the second source/drain 155 are doped with a first material (e.g., boron (B)). Forming a second nanosheet transistor (NFET) that includes a third source/drain 157 and fourth source/drain 212. The third source/drain 157 and the fourth source/drain 212 are doped with a second material (e.g., phosphorus (P)). The first material and the second material are different. Forming a placeholder 150 is located on a backside surface of the second source/drain 155 and the placeholder 150 is doped with a third material (SiGe: B). The third material is the same as the first material (e.g., boron (B)). Removing the second placeholder 150 and doping the fourth source/drain 157/212 with the second material to increase the concentration of the second material in the fourth source/drain 212.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:
   a first nanosheet transistor that includes a first source/drain and a second source/drain, wherein the first source/drain and the second source/drain are doped with a first material;
   a second nanosheet transistor that includes a third source/drain and fourth source/drain, wherein the third source/drain and the fourth source/drain are doped with a second material, wherein the first material and the second material are different; and
   a placeholder located on a backside surface of the second source/drain, wherein the placeholder is doped with a third material, wherein the third material is the same as the first material.

2. The microelectronic structure of claim 1, wherein the first material is boron (B), and wherein the second material is phosphorous (P).

3. The microelectronic structure of claim 2, further comprising:
   a backside contact in direct contact with the placeholder, wherein the placeholder provides an electrical connection between the second source/drain and backside contact.

4. The microelectronic structure of claim 1, wherein the first material is phosphorous (P), and wherein the second material is boron (B).

5. The microelectronic structure of claim 4, further comprising:
   a backside contact in direct contact with the placeholder, wherein the placeholder provides an electrical connection between the second source/drain and backside contact.

6. The microelectronic structure of claim 1, further comprising:
   a backside contact that is connected to the backside surface of the fourth source/drain.

7. The microelectronic structure of claim 6, wherein a top surface of the backside contact has a first width, a middle section of the backside contact has a second width, and a bottom section of the backside contact has a third width.

8. The microelectronic structure of claim 7, wherein the first width, second width, and the third width are all different.

9. The microelectronic structure of claim 8, wherein the first width is larger than the second width and the third width, and wherein the second width is larger than the third width.

10. A microelectronic structure comprising:
   a first nanosheet transistor that includes a first source/drain and a second source/drain, wherein the first source/drain and the second source/drain are doped with a first material;
   a second nanosheet transistor that includes a third source/drain and fourth source/drain, wherein the third source/drain and the fourth source/drain are doped with a second material, wherein the first material and the second material are different, wherein the third source/drain and the fourth source/drain have different concentrations of the second material; and
   a placeholder located on a backside surface of the second source/drain, wherein the placeholder is doped with a third material, wherein the third material is the same as the first material.

11. The microelectronic structure of claim 10, wherein the first material is boron (B), and wherein the second material is phosphorous (P).

12. The microelectronic structure of claim 10, wherein the first material is phosphorous (P), and wherein the second material is boron (B).

13. The microelectronic structure of claim 10, wherein the dopant concentration of the second material in the fourth source/drain is higher than the dopant concentration of the second material in the third source/drain.

14. The microelectronic structure of claim 13, further comprising:

a backside contact that is connected to the backside surface of the fourth source/drain.

15. The microelectronic structure of claim 14, wherein a top surface of the backside contact has a first width, a middle section of the backside contact has a second width, and a bottom section of the backside contact has a third width.

16. The microelectronic structure of claim 15, wherein the first width, second width, and the third width are all different.

17. The microelectronic structure of claim 16, wherein the first width is larger than the second width and the third width, and wherein the second width is larger than the third width.

18. The microelectronic structure of claim 14, wherein the backside contact has a T-shape/bolt profile through a cross-section that passes through the second source/drain and the fourth source/drain.

19. A method comprising:

forming a first nanosheet transistor that includes a first source/drain and a second source/drain, wherein the first source/drain and the second source/drain are doped with a first material;

forming a second nanosheet transistor that includes a third source/drain and fourth source/drain, wherein the third source/drain and the fourth source/drain are doped with a second material, wherein the first material and the second material are different; and forming a first placeholder located on a backside surface of the second source/drain and a second placeholder located on the backside surface of the fourth source/drain, wherein the first placeholder and second placeholder are doped with a third material, wherein the third material is the same as the first material.

20. The method of claim 19, further comprising:

removing the second placeholder; and doping the fourth source/drain with the second material to increase the concentration of the second material in the fourth source/drain.

\* \* \* \* \*